(12) United States Patent
Kim

(10) Patent No.: US 11,955,963 B2
(45) Date of Patent: Apr. 9, 2024

(54) OUTPUT DRIVING CIRCUIT FOR GENERATING OUTPUT VOLTAGE BASED ON PLURALITY OF BIAS VOLTAGES AND OPERATING METHOD THEREOF

(71) Applicant: Samsung Electronics Co., Ltd., Suwon-si (KR)

(72) Inventor: Eonguk Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/890,509

(22) Filed: Aug. 18, 2022

(65) Prior Publication Data

US 2023/0082252 A1    Mar. 16, 2023

(30) Foreign Application Priority Data

Sep. 16, 2021    (KR) .................. 10-2021-0124263

(51) Int. Cl.
*H03K 17/687* (2006.01)
*H03K 19/003* (2006.01)
*H03K 19/0175* (2006.01)

(52) U.S. Cl.
CPC ... *H03K 17/6872* (2013.01); *H03K 19/00346* (2013.01); *H03K 19/0175* (2013.01)

(58) Field of Classification Search
CPC .............. H03K 17/04; H03K 17/042; H03K 17/04206; H03K 17/06; H03K 17/063; H03K 17/08; H03K 17/082; H03K 17/0822; H03K 17/16; H03K 17/161; H03K 17/687; H03K 17/6871; H03K 17/6872; H03K 17/693; H03K 19/003; H03K 19/00315; H03K 19/00346; H03K 19/00361; H03K 19/01; H03K 19/017; H03K 19/0175; H03K 19/0185
See application file for complete search history.

(56) References Cited

U.S. PATENT DOCUMENTS

| | | |
|---|---|---|
| 6,081,132 A | 6/2000 | Isbara |
| 6,859,074 B2 | 2/2005 | Ajit |
| 7,362,136 B2 | 4/2008 | Chen |
| 7,649,384 B2 | 1/2010 | Ho et al. |
| 7,868,659 B2 | 1/2011 | Ker et al. |
| 8,421,501 B1 | 4/2013 | Rien et al. |
| 9,118,315 B2 | 8/2015 | P et al. |
| 9,294,081 B2 | 3/2016 | Park et al. |
| 9,385,718 B1 | 7/2016 | Liu et al. |

(Continued)

*Primary Examiner* — Long Nguyen
(74) *Attorney, Agent, or Firm* — HARNESS, DICKEY & PIERCE, P.L.C.

(57) ABSTRACT

An output driving circuit includes: a plurality of bias voltage generating circuits configured to generate a plurality of bias voltages; a switching control circuit; and an output voltage generating circuit. The switching control circuit is configured to selectively connect one bias voltage generating circuit of the plurality of bias voltage generating circuits to the output voltage generating circuit based on an output voltage. The output voltage generating circuit is configured to transmit and receive a parasitic current generated due to transition of the output voltage to and from the one bias voltage generating circuit selectively connected to the output voltage generating circuit through the switching control circuit.

20 Claims, 11 Drawing Sheets

(56) References Cited

U.S. PATENT DOCUMENTS

| | | |
|---|---|---|
| 10,236,868 B2 | 3/2019 | Takayanagi |
| 10,892,760 B1 | 1/2021 | Rao et al. |
| 2014/0002146 A1* | 1/2014 | Kim ............... H03K 19/018521 |
| | | 327/333 |
| 2015/0130511 A1* | 5/2015 | P .................... H03K 19/017509 |
| | | 326/88 |

* cited by examiner

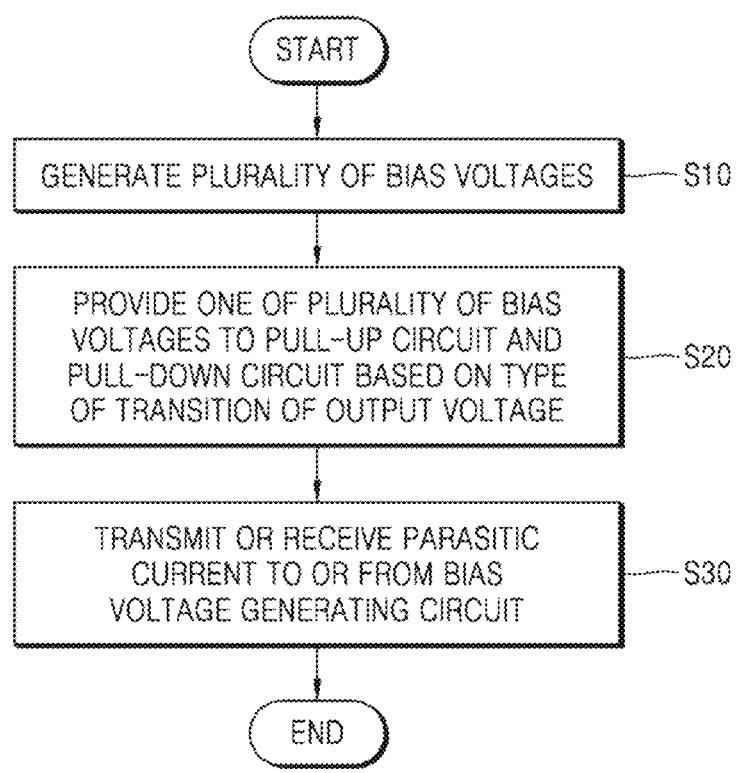

OUTPUT DRIVING CIRCUIT FOR GENERATING OUTPUT VOLTAGE BASED ON PLURALITY OF BIAS VOLTAGES AND OPERATING METHOD THEREOF

CROSS-REFERENCE TO RELATED APPLICATION

This application is based on and claims priority under 35 U.S.C. § 119 to Korean Patent Application No. 10-2021-0124263, filed on Sep. 16, 2021, in the Korean Intellectual Property Office, the disclosure of which is incorporated by reference herein in its entirety.

BACKGROUND

The inventive concepts relate to output driving circuits, and more particularly, to output driving circuits for generating an output voltage based on a plurality of bias voltages.

Recently, as the cost of integrating a logic device with a low supply voltage and an input/output (I/O) device with a high supply voltage has increased due to scaling-down of a semiconductor process, there is an increasing demand to construct an I/O circuit using only low voltage I/O devices instead of high voltage I/O devices.

The I/O circuit may consist of transistors having a stack structure including low voltage devices so that a voltage across gate and drain/source terminals of a low voltage device does not exceed an allowable voltage during operation of a high voltage power supply, and need to be supplied with appropriate bias voltages.

SUMMARY

Some example embodiments of the inventive concepts provide an output driving circuit capable of reducing an effect of a parasitic current, which is generated during transition of an output voltage, on a bias voltage.

According to some example embodiments of the inventive concepts, an output driving circuit may include a plurality of bias voltage generating circuits configured to generate a plurality of bias voltages; a switching control circuit; and an output voltage generating circuit. The switching control circuit may be configured to selectively connect one bias voltage generating circuit of the plurality of bias voltage generating circuits to the output voltage generating circuit based on an output voltage. The output voltage generating circuit may be configured to transmit and receive a parasitic current generated due to transition of the output voltage to and from the one bias voltage generating circuit selectively connected to the output voltage generating circuit through the switching control circuit.

According to some example embodiments of the inventive concepts, a method of driving an output voltage may include: generating, by a plurality of bias voltage generating circuits, a plurality of bias voltages; determining, based on a type of transition of the output voltage, one of the plurality of bias voltage generating circuits for a pull-up transistor circuit and a pull-down transistor circuit; and transmitting and receiving a parasitic current that is generated due to transition of the output voltage to and from the one of the plurality of bias voltage generating circuits.

According to some example embodiments of the inventive concepts, an output driving circuit may include: a pull-up circuit configured to cause an output voltage to transition from a low level to a high level based on connecting a power supply node to an output node in response to a pull-up signal; a pull-down circuit configured to cause the output voltage to transition from the high level to the low level based on connecting a ground node to the output node in response to a pull-down signal; a first bias voltage generating circuit configured to provide a first bias voltage to the pull-up circuit and the pull-down circuit in response to the output voltage having a first type of transition, and receive a parasitic current generated in the pull-up circuit and the pull-down circuit; a second bias voltage generating circuit configured to provide a second bias voltage to the pull-up circuit and the pull-down circuit in response to the output voltage having a second type of transition, and provide a parasitic current to the pull-up circuit and the pull-down circuit; and a switching control circuit configured to connect, according to a level of the output voltage, one of the first bias voltage generating circuit or the second bias voltage generating circuit to the pull-up circuit and the pull-down circuit.

BRIEF DESCRIPTION OF THE DRAWINGS

Example embodiments of the inventive concepts will be more clearly understood from the following detailed description taken in conjunction with the accompanying drawings in which:

FIG. 8 is a flowchart of a method, performed by a bias voltage generating circuit and an output voltage generating circuit, of transmitting and receiving a parasitic current, according to some example embodiments of the inventive concepts;

DETAILED DESCRIPTION

Hereinafter, some example embodiments of the inventive concepts will be described in detail with reference to the accompanying drawings.

It will be understood that elements and/or properties thereof may be recited herein as being "the same" or "equal" as other elements and/or properties thereof, and it will be further understood that elements and/or properties thereof recited herein as being "identical" to, "the same" as, or "equal" to other elements and/or properties thereof may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 1:
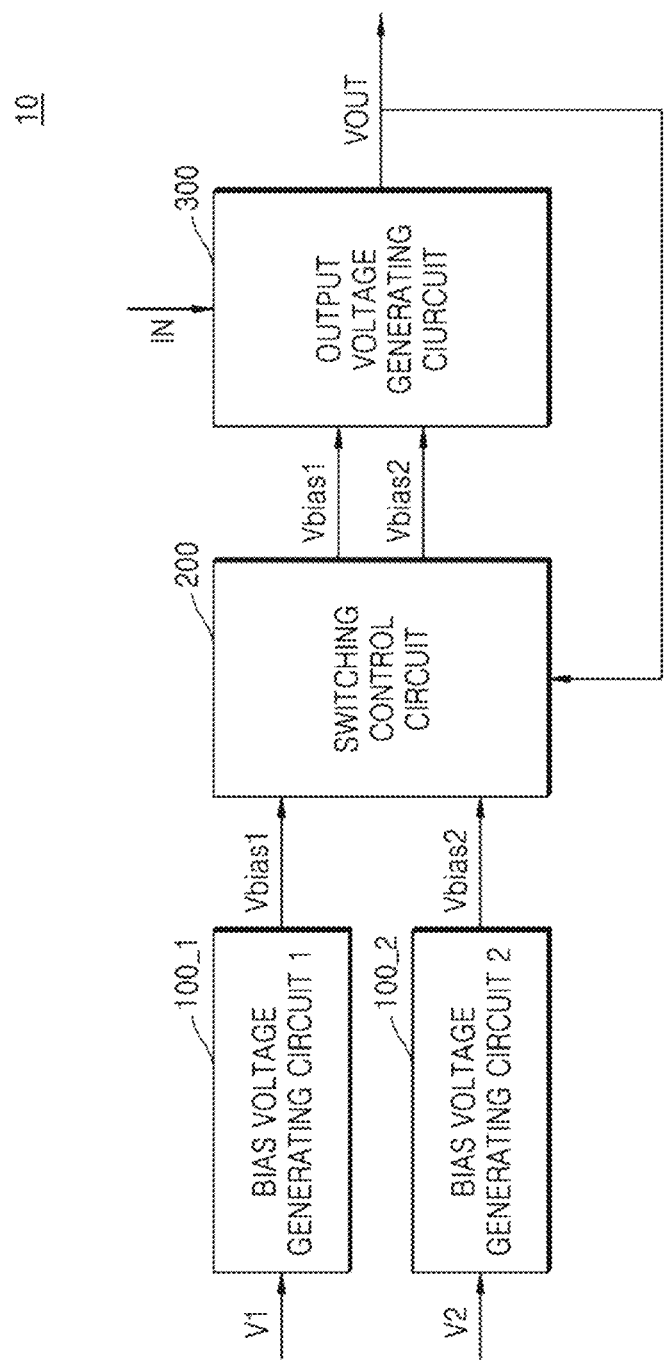
FIG. 1 is a schematic block diagram of an output driving circuit according to some example embodiments of the inventive concepts.

FIG. 1 is a schematic block diagram of an output driving circuit 10 according to some example embodiments of the inventive concepts.

Referring to FIG. 1, the output driving circuit 10 may include a plurality of bias voltage generating circuits, a switching control circuit 200, and an output voltage generating circuit 300. The plurality of bias voltage generating circuits may include a first bias voltage generating circuit, (e.g., bias voltage generating circuit 1), 100_1 and a second bias voltage generating circuit, (e.g., bias voltage generating circuit 2), 100_2, but the number (e.g., quantity) of bias voltage generating circuits according to some example embodiments of the inventive concepts is not limited thereto.

The first bias voltage generating circuit 100_1 may generate a first bias voltage Vbias1 based on a first voltage V1 received from outside the output driving circuit 10, and the second bias voltage generating circuit 100_2 may generate a second bias voltage Vbias2 based on a second voltage V2. The first and second bias voltage generating circuits 100_1 and 100_2 are respectively connected to a power supply to generate first and second bias voltages Vbias1 and Vbias2, and transmit or receive a parasitic current generated according to a type of transition of an output voltage VOUT to or from the output voltage generating circuit 300.

For example, the first bias voltage generating circuit 100_1 may generate the first bias voltage Vbias1, and when providing the first bias voltage Vbias1 to the output voltage generating circuit 300, the first bias voltage generating circuit 100_1 may receive a parasitic current generated in the output voltage generating circuit 300 and draw the parasitic current to a ground node. The second bias voltage generating circuit 100_2 may generate the second bias voltage Vbias2, and when providing the second bias voltage Vbias2 to the output voltage generating circuit 300, the second bias voltage generating circuit 100_2 may supply a parasitic current to the output voltage generating circuit 300.

The switching control circuit 200 may receive a plurality of bias voltages generated by the plurality of bias voltage generating circuits, and provide (e.g., selectively provide) one of the plurality of bias voltages to the output voltage generating circuit 300 according to a level of the output voltage VOUT. The switching control circuit may be understood to be configured to selectively connect one bias voltage generating circuit (e.g., one of the first or second bias voltage generating circuits 100_1 or 100_2) to the output voltage generating circuit 300, for example based on the output voltage VOUT. For example, the switching control circuit 200 may output (e.g., selectively output) the first bias voltage Vbias1 (e.g., selectively output the first bias voltage Vbias1, based on selectively connecting the first bias voltage generating circuit 100_1 to the output voltage generating circuit 300) when (e.g., in response to) receiving output voltage VOUT that is at a low level as a feedback voltage, and the second bias voltage Vbias2 (e.g., selectively output the second bias voltage Vbias2, based on selectively connecting the second bias voltage generating circuit 100_2 to the output voltage generating circuit 300) when (e.g., in response to) receiving output voltage VOUT that is at a high level as a feedback voltage.

The output voltage generating circuit 300 may receive one of the plurality of bias voltages from the switching control circuit 200. In detail, the output voltage generating circuit 300 may include a pull-down circuit and a pull-up circuit, and the pull-down circuit and the pull-up circuit may be biased based on the received bias voltage.

The output voltage generating circuit 300 may receive an input signal IN swinging between a ground voltage and a high supply voltage. The biased pull-down circuit may pull the output voltage VOUT down to a low level when a pull-down signal is activated (e.g., in response to receiving a pull-down signal). The biased pull-up circuit may pull the output voltage VOUT up to a high level when a pull-up signal is activated (e.g., in response to receiving a pull-up signal).

Hereinafter, the inventive concepts may be described with reference to the configuration of FIG. 1.

Figure 2:
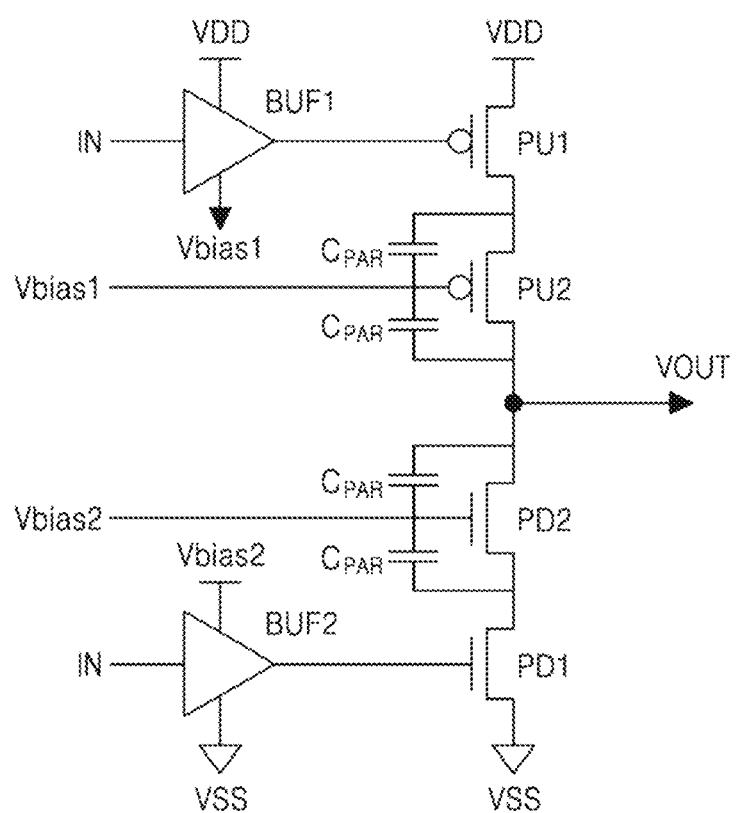
FIG. 2 is a circuit diagram illustrating an example in which different bias voltages are supplied to a pull-down circuit and a pull-up circuit of an output voltage generating circuit, according to some example embodiments.

FIG. 2 is a circuit diagram illustrating an example in which different bias voltages are supplied to a pull-down circuit and a pull-up circuit of an output voltage generating circuit, according to some example embodiments.

Referring to FIG. 2, the output voltage generating circuit may include a first pull-up transistor PU1, a second pull-up transistor PU2, a first pull-down transistor PD1, and a second pull-down transistor PD2. The second pull-up transistor PU2 may receive first bias voltage Vbias1 at its gate terminal, and the second pull-down transistor PD2 may receive second bias voltage Vbias2 at its gate terminal. For example, the second pull-up transistor PU2 may be configured to be activated in response to the first bias voltage Vbias1, and be deactivated in response to the second bias voltage Vbias2; the second pull-down transistor PD2 may be configured to be deactivated in response to the first bias voltage Vbias1, and be activated in response to the second bias voltage Vbias2.

The output voltage generating circuit 300 requires a high current driving capability to generate an output voltage VOUT based on a plurality of pull-down transistors and a plurality of pull-up transistors. Transistors may occupy a large area on an integrated circuit including an output driving circuit, and a parasitic capacitor $C_{PAR}$ of a transistor may also have a large capacitance in proportion to a size of the transistor. Accordingly, each time the output voltage VOUT of the output driving circuit transitions, a parasitic current flows into or out of a bias input terminal due to the parasitic capacitor $C_{PAR}$. Although the output driving circuit requires a large static current or a decoupling capacitor at the bias input terminal to stabilize a bias voltage received at the bias input terminal, the large static current causes increased power consumption, and use of the decoupling capacitor requires a larger output driving circuit.

As described below, some example embodiments of the inventive concepts may reduce an effect of a parasitic current on a bias voltage without using a large static current and a decoupling capacitor.

Figure 3:
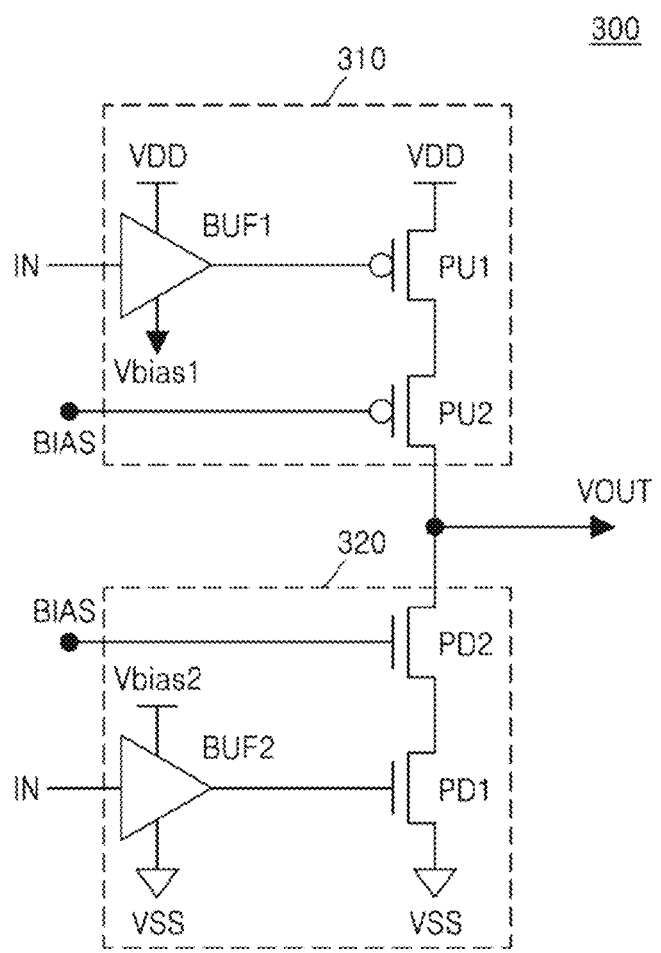
FIG. 3 is a circuit diagram illustrating an output voltage generating circuit according to some example embodiments of the inventive concepts.

FIG. 3 is a circuit diagram illustrating an output voltage generating circuit 300 according to some example embodiments of the inventive concepts.

The output voltage generating circuit 300 of FIG. 3 may be some example embodiments of the output voltage generating circuit 300 of FIG. 1.

Referring to FIG. 3, according to some example embodiments, the output voltage generating circuit 300 may include a pull-up circuit 310 including a first buffer BUF1, a first pull-up transistor PU1, and a second pull-up transistor PU2, and a pull-down circuit 320 including a second buffer BUF2, a first pull-down transistor PD1, and a second pull-down transistor PD2. The pull-up circuit 310 and the pull-down circuit 320 may receive an input signal IN and a bias voltage determined as one of a plurality of bias voltages according to a type of transition of an output voltage VOUT. The pull-up circuit 310 may be connected to a node for outputting a supply voltage VDD while the pull-down circuit 320 may be connected to a ground node.

The first buffer BUF1 may receive an input signal IN variable between a ground voltage VSS and a supply voltage VDD, and scale down the input signal IN to generate a pull-up signal variable between a first bias voltage Vbias1 and the supply voltages VDD. For example, the supply voltage VDD may be 3.3 V, and the input signal IN may be a signal varying between 0 V and 3.3 V. The first bias voltage Vbias1 may be 1.5 V, and the pull-up signal obtained by scaling down the input signal IN may be a signal varying between 1.5 V and 3.3 V.

The first pull-up transistor PU1 may receive the pull-up signal at a gate terminal thereof and provide the supply voltage VDD in response to the activated pull-up signal. The first pull-up transistor PU1 may be a p-type metal-oxide-semiconductor (PMOS) transistor, and may be turned on when (e.g., in response to) a difference between a voltage level of the pull-up signal and a level of the supply voltage VDD is greater than or equal to a threshold voltage of the first pull-up transistor PU1.

A gate terminal of the second pull-up transistor PU2 may be connected to a bias input terminal BIAS of the switching control circuit 200, and receive one of a plurality of bias voltages through the bias input terminal BIAS. The second pull-up transistor PU2 may provide a voltage received from the first pull-up transistor PU1 in response to the activated bias voltage. The second pull-up transistor PU2 may be a PMOS transistor, and may be turned on when (e.g., in response to) a difference between a level of the bias voltage and a voltage level at node between the first and second pull-up transistors PU1 and PU2 is greater than or equal to a threshold voltage of the second pull-up transistor PU2.

The second buffer BUF2 may receive an input signal IN variable between a ground voltage VSS and a supply voltage VDD, and scale down the input signal IN to generate a pull-down signal variable between the ground voltage VSS and a second bias voltage Vbias2. For example, the second bias voltage Vbias2 may be 1.8 V, and the pull-down signal obtained by scaling down the input signal IN may be a signal varying between 0 V and 1.8 V.

The first pull-down transistor PD1 may receive the pull-down signal at a gate terminal thereof and provide the ground voltage VSS in response to the activated pull-down signal. The first pull-down transistor PD1 may be an n-type MOS (NMOS) transistor, and may be turned on when (e.g., in response to) a difference between a voltage level of the pull-down signal and a level of the ground voltage VSS is greater than or equal to a threshold voltage of the first pull-down transistor PD1.

A gate terminal of the second pull-down transistor PD2 may be connected to the bias input terminal BIAS of the switching control circuit 200, and receive one of a plurality of bias voltages through the bias input terminal BIAS. The second pull-down transistor PD2 may provide a voltage received from the first pull-down transistor PD1 according to a level of the bias voltage. The second pull-down transistor PD2 may be an NMOS transistor, and may be turned on when (e.g., in response to) a difference between a level of the bias voltage and a voltage level at node between the first and second pull-down transistors PD1 and PD2 is greater than or equal to a threshold voltage of the second pull-down transistor PD2.

According to some example embodiments, a plurality of bias voltage generating circuits may generate a plurality of bias voltages and provide one of the plurality of bias voltages to a bias input terminal BIAS of the output voltage generating circuit 300 according to a type of transition of the output voltage VOUT. In this case, a bias voltage generating circuit connected to the bias input terminal BIAS may receive a parasitic current generated by the output voltage generating circuit 300 to draw the parasitic current to a ground node or output the parasitic current to the output voltage generating circuit 300 through a power supply node.

When (e.g., in response to) large currents flow into or out of parasitic capacitors $C_{PAR}$ during a transition of the output voltage VOUT by the pull-up circuit 310 and the pull-down circuit 320, a bias voltage may fluctuate significantly, but variations in a bias voltage due to a parasitic current may be reduced by sinking or driving a dynamic current through a bias voltage generating circuit.

Connection of a bias voltage generating circuit to the output voltage generating circuit 300 according to each type of transition and a flow of a parasitic current in each type of transition are described in detail below with reference to FIGS. 10 and 11.

In some example embodiments, the one bias voltage received at the second pull-down transistor PD2 may be the same or different bias voltage in relation to the one bias voltage received at the second pull-up transistor PU2, that is, the one bias voltage received at the second pull-down transistor PD2 may be the same as or different from the one bias voltage received at the second pull-up transistor PU2 (e.g., in some example embodiments, PD2 and PU2 may both receive Vbias1 or may both receive Vbias2, and in some example embodiments PD2 and PU2 may receive a different bias voltage of Vbias1 or Vbias2). Accordingly, it will be understood that in some example embodiments the pull-up circuit 310 may include a first pull-up transistor PU1 that may be configured to receive a pull-up signal and a second pull-up transistor PU2 that may be configured to receive one bias voltage of the plurality of bias voltages, and the pull-down circuit 320 may include a first pull-down transistor PD1 that may be configured to receive a pull-down signal and a second pull-down transistor PD2 connected to the first pull-down transistor PD1 in cascade and that may be configured to receive one bias voltage of the plurality of bias voltages that may be a same bias voltage or a different bias voltage in relation to the one bias voltage received by the second pull-up transistor PU2.

Figure 4:
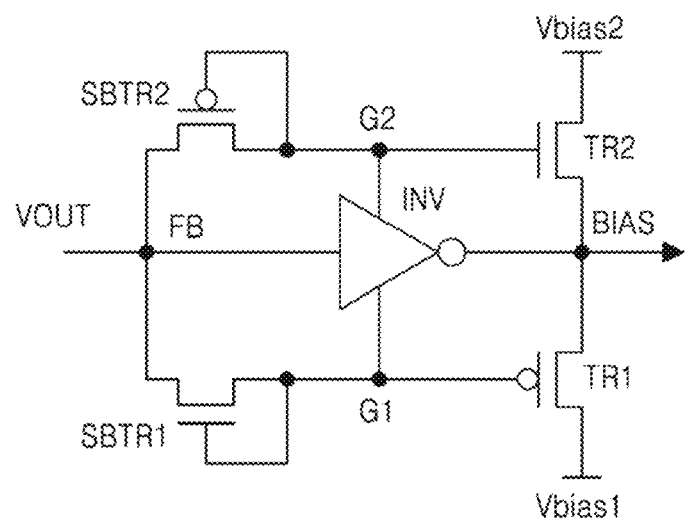
FIG. 4 is a circuit diagram illustrating a switching control circuit according to some example embodiments of the inventive concepts.

FIG. 4 is a circuit diagram illustrating the switching control circuit 200 according to some example embodiments of the inventive concepts.

The switching control circuit 200 of FIG. 4 to be described below may be some example embodiments of the switching control circuit 200 described above with reference to FIG. 1.

Referring to FIG. 4, according to some example embodiments, the switching control circuit 200 may include a first transistor TR1, a second transistor TR2, and an inverter INV. The first transistor TR1 may have one end connected to the first bias voltage generating circuit 100_1 to receive the first bias voltage Vbias1, while the second transistor TR2 may have one end connected to the second bias voltage generating circuit 100_2 to receive the second bias voltage Vbias2.

According to some example embodiments, the first transistor TR1 may be a PMOS transistor and may be turned on when (e.g., in response to) a signal input to a first gate node G1 is at a low level to pass the first bias voltage Vbias1 to a bias input terminal BIAS. The second transistor TR2 may be an NMOS transistor and may be turned on when (e.g., in response to) a signal input to a second gate node G2 is at a high level to pass the second bias voltage Vbias2 to the bias input terminal BIAS. In this case, the first and second gate nodes G1 and G2 may be connected to the inverter INV, and voltages of the first and second gate nodes G1 and G2 may be determined according to a voltage level of the bias input terminal BIAS. Some example embodiments in which the voltages of the first and second gate nodes G1 and G2 are determined according to the voltage level of (e.g., magnitude of voltage at) the bias input terminal BIAS is described below with reference to FIG. 5.

The switching control circuit 200 may further include first and second self-biasing transistors SBTR1 and SBTR2. The first and second self-biasing transistors SBTR1 and SBTR2 may each have a source terminal connected to a feedback node FB, and may be activated or deactivated according to the output voltage VOUT. For example, the first self-biasing transistor SBTR1 may be an NMOS transistor and may be activated when (e.g., in response to) the output voltage VOUT having a low level is provided to the feedback node FB. The second self-biasing transistor SBTR2 may be a PMOS transistor and activated when (e.g., in response to) the output voltage VOUT having a high level is provided to the feedback node FB.

When (e.g., in response to) the switching control circuit 200 receives the output voltage VOUT having a high level through the feedback node FB, the second self-biasing transistor SBTR2 may be turned on so that the second gate node G2 may transition to a high level. For example, when (e.g., in response to) the switching control circuit 200 receives output voltage VOUT having a supply voltage level through the feedback node FB, a voltage level of the second gate node G2 may increase by the supply voltage level minus a threshold voltage level of the second self-biasing transistor SBTR2. After transitioning to the high level, the voltage level of the second gate node G2 may be input to a gate terminal of the second transistor TR2 to turn on the second transistor TR2. When (e.g., in response to) the second transistor TR2 is turned on, the second bias voltage Vbias2 may be switched and applied to the bias input terminal BIAS. Accordingly, when (e.g., in response to) receiving the output voltage VOUT having a high level as a feedback voltage, the switching control circuit 200 may connect the second bias voltage generating circuit 100_2 to the output voltage generating circuit 300. It will be understood that a high level or low level of a voltage may refer to a high magnitude (e.g., 1.8V) or low magnitude (e.g., 0.8V), respectively, of a voltage.

When (e.g., in response to) the switching control circuit 200 receives the output voltage VOUT having a low level through the feedback node FB, the first self-biasing transistor SBTR1 is turned on so that the first gate node G1 may transition to a low level. For example, when (e.g., in response to) the switching control circuit 200 receives output voltage VOUT having a ground level through the feedback node FB, a voltage level of the first gate node G1 may decrease by a threshold voltage level of the first self-biasing transistor SBTR1. After transitioning to the low level, the voltage level of the first gate node G1 may be input to a gate terminal of the first transistor TR1 to turn on the first transistor TR1. When (e.g., in response to) the first transistor TR1 is turned on, the first bias voltage Vbias1 may be switched and applied to the bias input terminal BIAS. Accordingly, when (e.g., in response to) receiving the output voltage VOUT having a low level as a feedback voltage, the switching control circuit 200 may connect the first bias voltage generating circuit 100_1 to the output voltage generating circuit 300.

Figure 5:
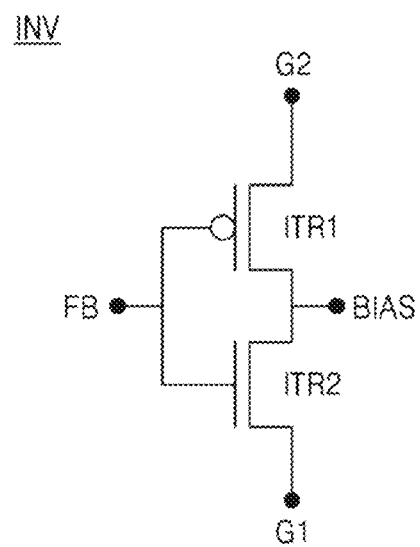
FIG. 5 is a circuit diagram illustrating an inverter included in a switching control circuit, according to some example embodiments of the inventive concepts.

FIG. 5 is a circuit diagram illustrating the inverter INV included in the switching control circuit 200, according to some example embodiments.

Referring to FIG. 5, the inverter INV may have an input terminal connected to the feedback node FB and an output terminal connected to the bias input terminal BIAS. The inverter INV may also have a first power supply terminal connected to the second gate node G2 and a second power supply terminal connected to the first gate node G1. According to some example embodiments of the inventive concepts, when (e.g., in response to) the first and second gate nodes G1 and G2 are floated, a voltage level of the bias input terminal BIAS may be applied to the first or second gate node G1 or G2 according to a level of the input terminal of the inverter INV.

When (e.g., in response to) the output voltage VOUT having a high level is received through the feedback node FB, as described above with reference to FIG. 4, the second gate node G2 may transition to a high level, and the second bias voltage Vbias2 may be applied to the bias input terminal BIAS. In this case, the first self-biasing transistor SBTR1 may be turned off, and the first gate node G1 may be floated.

When (e.g., in response to) the output voltage VOUT having the high level is input to gate terminals of first and second inverter transistors ITR1 and ITR2 through the feedback node FB, the first inverter transistor ITR1 may be turned off while the second inverter transistor ITR2 may be turned on. Accordingly, the second bias voltage Vbias2 applied to the bias input terminal BIAS may be applied to the first gate node G1.

When (e.g., in response to) the output voltage VOUT having a low level is received through the feedback node FB, as described above with reference to FIG. 4, a voltage of the first gate node G1 may transition to a low level, and the first bias voltage Vbias1 may be applied to the bias input terminal BIAS. In this case, the second self-biasing transistor SBTR2 may be turned off, and the second gate node G2 may be floated.

When (e.g., in response to) the output voltage VOUT having the low level is input to the gate terminals of the first and second inverter transistors ITR1 and ITR2 through the feedback node FB, the first inverter transistor ITR1 may be turned on while the second inverter transistor ITR2 may be turned on. Accordingly, the first bias voltage Vbias1 applied to the bias input terminal BIAS may be applied to the second gate node G2.

Figure 6A:
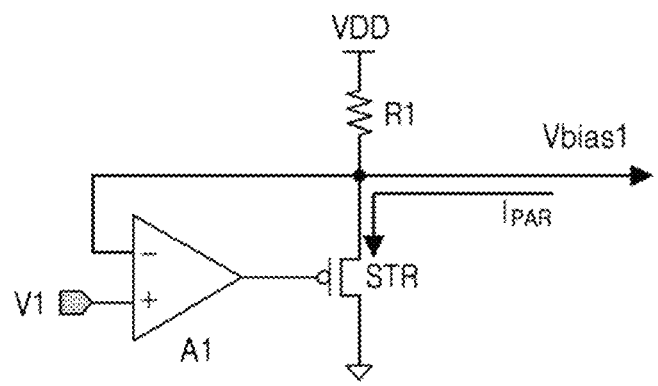
FIGS. 6A and 6B are circuit diagrams illustrating a first bias voltage generating circuit for generating a first bias voltage, according to some example embodiments of the inventive concepts.
Figure 6B:
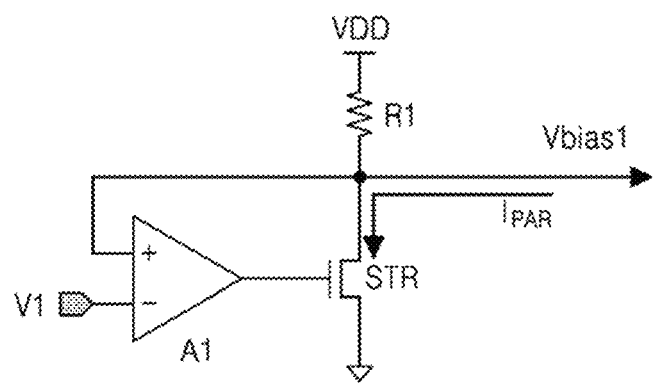

FIGS. 6A and 6B are circuit diagrams illustrating a first bias voltage generating circuit 100_1 for generating a first bias voltage Vbias1, according to some example embodiments of the inventive concepts.

Referring to FIGS. 6A and 6B, the first bias voltage generating circuit 100_1 may include a first amplifier A1 (or, a first comparator), a first resistor R1, and a sinking transistor STR. The first amplifier A1 may receive a first bias voltage Vbias1 through a first input terminal and a first voltage V1 through a second input terminal. The sinking transistor STR may sink a current received at a drain or source terminal to a ground node.

The sinking transistor STR of FIG. 6A may be a PMOS transistor, and the first and second input terminals of the first amplifier A1 may be respectively configured as negative (−) and positive (+) terminals. The sinking transistor STR of FIG. 6B may be an NMOS transistor, and the first and second input terminals of the first amplifier A1 may be respectively configured as positive (+) and negative (−) terminals.

Referring to FIG. 6A, the first amplifier A1 may compare the first bias voltage Vbias1 received at the first input terminal with the first voltage V1 received at the second input terminal, and provide a comparison result of a low level to the sinking transistor STR when (e.g., in response to) the first bias voltage Vbias1 is greater than the first voltage V1.

The sinking transistor STR may be turned on in response to receiving the comparison result of the low level at a gate terminal thereof. When (e.g., in response to) the first bias voltage generating circuit 100_1 is connected (e.g., selectively connected, by the switching control circuit 200) to the output voltage generating circuit 300, the first bias voltage generating circuit 100_1 may receive a parasitic current $I_{PAR}$ to draw the parasitic current $I_{PAR}$ to a ground node through the sinking transistor STR. When (e.g., in response to) the sinking transistor STR is activated, a static current generated by the first resistor R1 and the parasitic current $I_{PAR}$ may be transmitted to a ground node through the sinking transistor STR. In this case, when (e.g., in response to) a resistance of the first resistor R1 is set to a large value (e.g., a large magnitude), a static current having a small magnitude may be generated. Accordingly, the first bias voltage generating circuit 100_1 may reduce power consumption due to the static current.

Referring to FIG. 6B, the first amplifier A1 may compare the first bias voltage Vbias1 received at the first input terminal with the first voltage V1 received at the second input terminal, and provide a comparison result of a high level to the sinking transistor STR when (e.g., in response to) the first bias voltage Vbias1 is greater than the first voltage V1. The sinking transistor STR may be turned on by receiving the comparison result of the high level through a gate terminal thereof. An operation, performed by the first bias voltage generating circuit 100_1, of receiving the parasitic current $I_{PAR}$ and reducing the static current to reduce power consumption due to the static current has been described with reference to FIG. 6A, and thus, a detailed description thereof will be omitted.

Figure 7A:
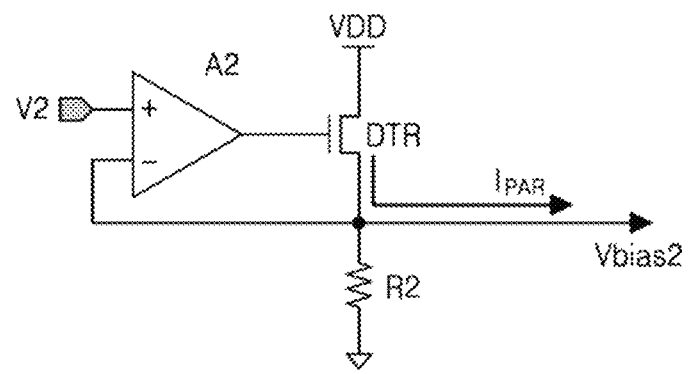
FIGS. 7A and 7B are circuit diagrams illustrating a second bias voltage generating circuit for generating a second bias voltage, according to some example embodiments of the inventive concepts.
Figure 7B:
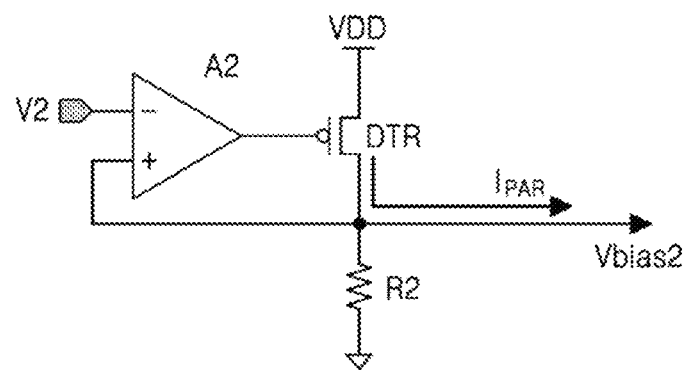

FIGS. 7A and 7B are circuit diagrams illustrating the second bias voltage generating circuit 100_2 for generating a second bias voltage Vbias2, according to some example embodiments of the inventive concepts.

Referring to FIGS. 7A and 7B, the second bias voltage generating circuit 100_2 may include a second amplifier A2 (or, a second comparator), a second resistor R2, and a driving transistor DTR. The second amplifier A2 may receive a second bias voltage Vbias2 through a first input terminal and a second voltage V2 through a second input terminal. The driving transistor DTR may be a transistor that, when turned on, provides a current received from a power supply node through a drain or source terminal to a second resistor R2 and the output voltage generating circuit 300.

The driving transistor DTR of FIG. 7A may be an NMOS transistor, and the first and second input terminals of the second amplifier A2 may be respectively configured as negative (−) and positive (+) terminals. The driving transistor DTR of FIG. 7B may be a PMOS transistor, and the first and second input terminals of the second amplifier A2 may be respectively configured as positive (+) and negative (−) terminals.

Referring to FIG. 7A, the second amplifier A2 may compare the second bias voltage Vbias2 received at the first input terminal with the second voltage V2 received at the second input terminal, and provide a comparison result of a high level to the driving transistor DTR when (e.g., in response to) the second voltage V2 is greater than the second bias voltage Vbias2.

The driving transistor DTR may be turned on by receiving the comparison result of the high level through a gate terminal thereof. When (e.g., in response to) the second bias voltage generating circuit 100_2 is connected (e.g., selectively connected, by the switching control circuit 200) to the output voltage generating circuit 300, the parasitic current $I_{PAR}$ may be provided from the power supply node to the output voltage generating circuit 300 through the driving transistor DTR. When (e.g., in response to) the driving transistor DTR is activated, a current flowing through the driving transistor DTR may include a static current generated by the second resistor R2 and a parasitic current $I_{PAR}$, and in this case, when (e.g., in response to) a resistance of the second resistor is high, a small static current may be generated. Accordingly, the second bias voltage generating circuit 100_2 of the inventive concepts may reduce power consumption due to the static current.

Referring to FIG. 7B, the second amplifier A2 may compare the second bias voltage Vbias2 received at the first input terminal with the second voltage V2 received at the second input terminal, and provide a comparison result of a low level to the driving transistor DTR when (e.g., in response to) the second voltage V2 is greater than the second bias voltage Vbias2. The driving transistor DTR may be turned on by receiving the comparison result of the low level through a gate terminal thereof. An operation, performed by the second bias voltage generating circuit 100_2, of receiving the parasitic current $I_{PAR}$ and reducing the static current to reduce power consumption due to the static current has been described with reference to FIG. 6A, and thus, a detailed description thereof will be omitted.

FIG. 8 is a flowchart of a method, performed by a bias voltage generating circuit and an output voltage generating circuit, of transmitting and receiving a parasitic current, according to some example embodiments of the inventive concepts.

Referring to FIG. 8, the output driving circuit 10 may generate a plurality of bias voltages and provide one of the plurality of bias voltages as a bias voltage for the output voltage generation circuit 300. In this case, a bias voltage generating circuit connected (e.g., selectively connected) to the output voltage generating circuit 300 may be determined according to a voltage level before transition of the output voltage VOUT, and a direction of a parasitic current may be determined according to a type of transition of the output voltage VOUT.

In operation S10, the output driving circuit 10 may generate a plurality of bias voltages. The plurality of bias voltages may have different voltage levels. For example, the output driving circuit 10 may generate first and second bias voltages Vbias1 and Vbias2 having different voltage levels. The first bias voltage Vbias1 may have a lower voltage level than the second bias voltage Vbias2. The first bias voltage Vbias1 may be input to a gate terminal of a PMOS transistor and bias the PMOS transistor to be turned on according to a voltage level of a source terminal of the PMOS transistor. The second bias voltage Vbias2 may be input to a gate terminal of an NMOS transistor and bias the NMOS transistor to be turned on according to a voltage level of a source terminal of the NMOS transistor.

In operation S20, the output driving circuit 10 may provide one of a plurality of bias voltages to a pull-up circuit and a pull-down circuit based on a type of transition of the output voltage VOUT. In detail, the switching control circuit 200 of the output driving circuit 10 may determine a bias voltage generating circuit to be connected (e.g., selectively connected, by the switching control circuit 200) to the output voltage generating circuit 300 based on a level before transition of the output voltage VOUT.

According to some example embodiments, the pull-up circuit and the pull-down circuit may receive the same bias voltage. When (e.g., in response to) the output voltage VOUT has a low-to-high transition, the first bias voltage Vbias1 may be provided to the pull-up circuit and the pull-down circuit. When (e.g., in response to) the output voltage VOUT has a high-to-low transition, the second bias voltage Vbias2 may be provided to the pull-up circuit and the pull-down circuit.

In operation S30, the bias voltage generating circuit determined among a plurality of bias voltage generating circuits in operation S20 may transmit or receive a parasitic current generated in the output voltage generating circuit 300. For example, when (e.g., in response to) the output voltage VOUT has a low-to-high transition, the output driving circuit 10 may draw a parasitic current flowing from a source or drain terminal of a pull-up transistor and/or a pull-down transistor to a gate terminal thereof to a ground node of the first bias voltage generating circuit 100_1. When (e.g., in response to) the output voltage VOUT has a high-to-low transition, the output driving circuit 10 may provide, by the second bias voltage generating circuit 100_2, a parasitic current flowing from a gate terminal of a pull-up transistor and/or a pull-down transistor to a source or drain terminal thereof.

Figure 9:
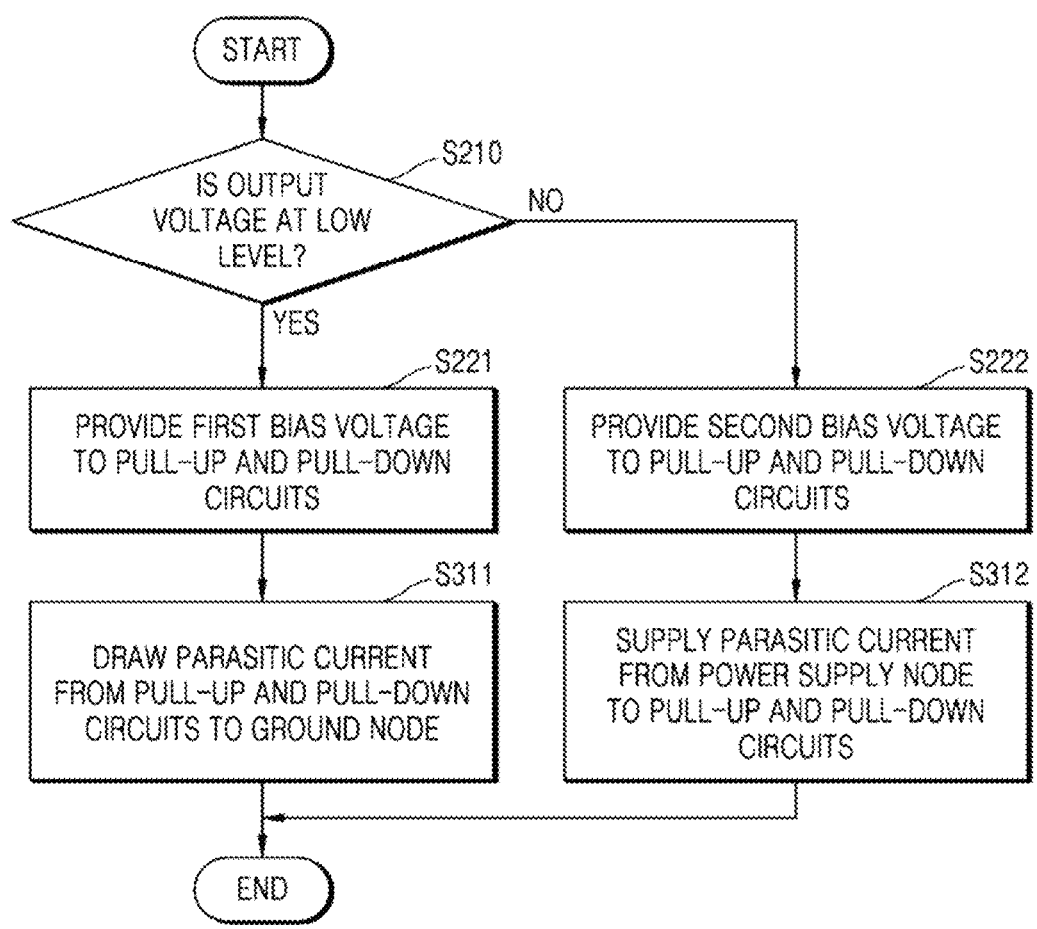
FIG. 9 is a flowchart of a method of transmitting and receiving parasitic currents in different types of transition, according to some example embodiments of the inventive concepts.

FIG. 9 is a flowchart of a method of transmitting and receiving parasitic currents in different types of transition of an output voltage VOUT, according to some example embodiments of the inventive concepts.

Referring to FIG. 9, the output driving circuit 10 may determine one of a first bias voltage Vbias1 or a second bias voltage Vbias2 as a bias voltage for a pull-up circuit and a pull-down circuit according to whether output voltage VOUT has a low-to-high or high-to-low transition. For example, the output driving circuit 10 may determine one of the first bias voltage generating circuit 100_1 and the second bias voltage generating circuit 100_2 for (e.g., to be connected to provide a respective bias voltage to) a pull-up circuit and a pull-down circuit based on a type of transition of the output voltage VOUT (e.g., whether output voltage VOUT has a low-to-high or high-to-low transition).

In operation S210, the output driving circuit 10 may determine whether the output voltage VOUT is at a low level. A state in which the output voltage VOUT is at a low level may correspond to a state before the output voltage VOUT has a low-to-high transition, and a state in which the output voltage VOUT is at a high level may correspond to a state before the output voltage VOUT has a high-to-low transition.

In operation S221, when (e.g., in response to) the output voltage VOUT is at a low level, the first bias voltage generating circuit 100_1 may provide a first bias voltage Vbias1 to the pull-up circuit and the pull-down circuit. When (e.g., in response to) the output voltage VOUT has a low-to-high transition, the switching control circuit 200 may connect (e.g., selectively connect) the first bias voltage generating circuit 100_1 to the output voltage generating circuit 300 because the output voltage VOUT is at a low level before the low-to-high transition.

In operation S222, when (e.g., in response to) the output voltage VOUT is at a high level, the second bias voltage generating circuit 100_2 may provide a second bias voltage Vbias2 to the pull-up circuit and the pull-down circuit. When (e.g., in response to) the output voltage VOUT has a high-to-low transition, the switching control circuit 200 may connect (e.g., selectively connect) the second bias voltage generating circuit 100_2 to the output voltage generating circuit 300 because the output voltage VOUT is at a high level before the high-to-low transition.

An operation, performed by the switching control circuit 200, of connecting (e.g., selectively connecting) one of the first or second bias voltage generating circuits 100_1 and 100_2 to the pull-up and pull-down circuits in operations S221 and S222 has been described above with reference to FIG. 4, and thus, a detailed description thereof will be omitted.

In operation S311, when (e.g., in response to) the first bias voltage Vbias1 is provided to the pull-up circuit and the pull-down circuit, and the output voltage VOUT has a low-to-high transition, the output driving circuit 10 may draw a parasitic current from the pull-up circuit and the pull-down circuit to a ground node of the first bias voltage generating circuit 100_1. An operation of drawing a parasitic current to a ground node of the first bias voltage generating circuit 100_1 will be described in detail with reference to FIG. 10.

In operation S312, when (e.g., in response to) the second bias voltage Vbias2 is provided to the pull-up circuit and the pull-down circuit, and the output voltage VOUT has a high-to-low transition, the second bias voltage generating circuit 100_2 provide a parasitic current to the output voltage generating circuit 300. An operation, performed by the second bias voltage generating circuit 100_2, of providing a parasitic current to the output voltage generating circuit 300 will be described in detail with reference to FIG. 11.

Figure 10:
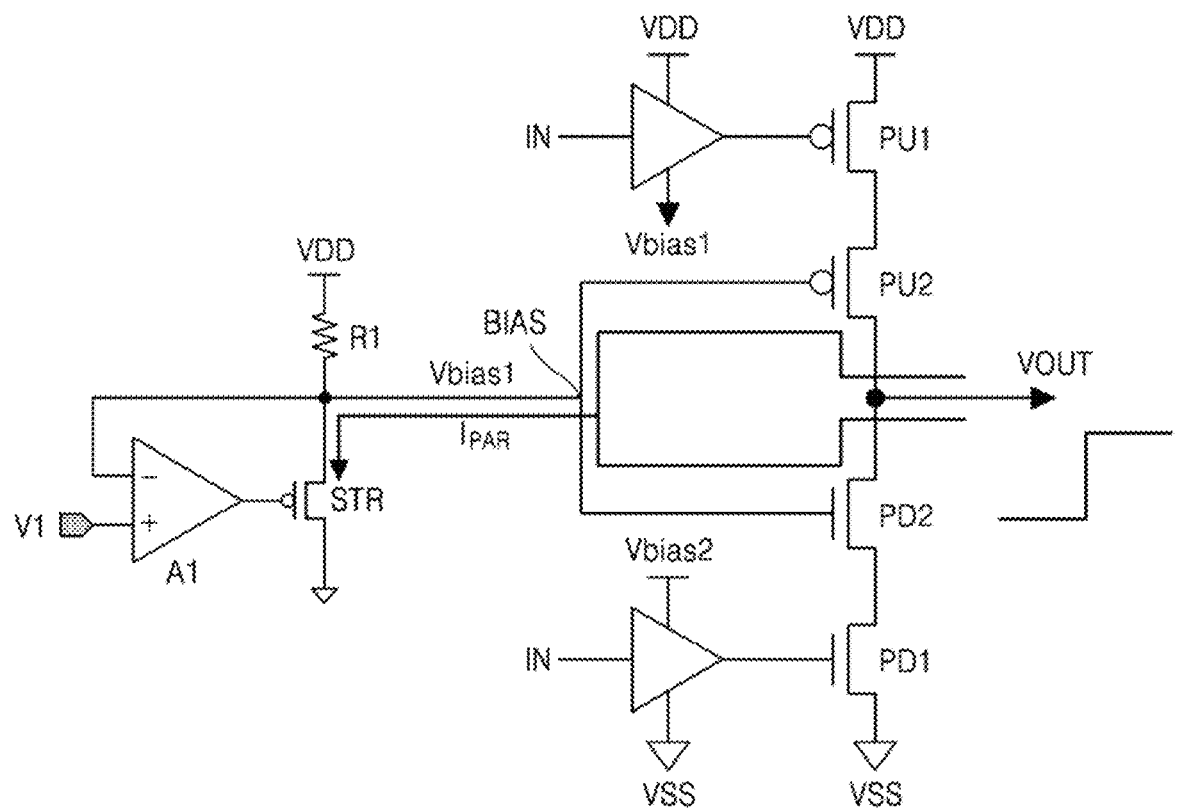
FIG. 10 is a circuit diagram illustrating an example in which a first bias voltage generating circuit receives a parasitic current when an output voltage increases, according to some example embodiments of the inventive concepts.
Figure 11:
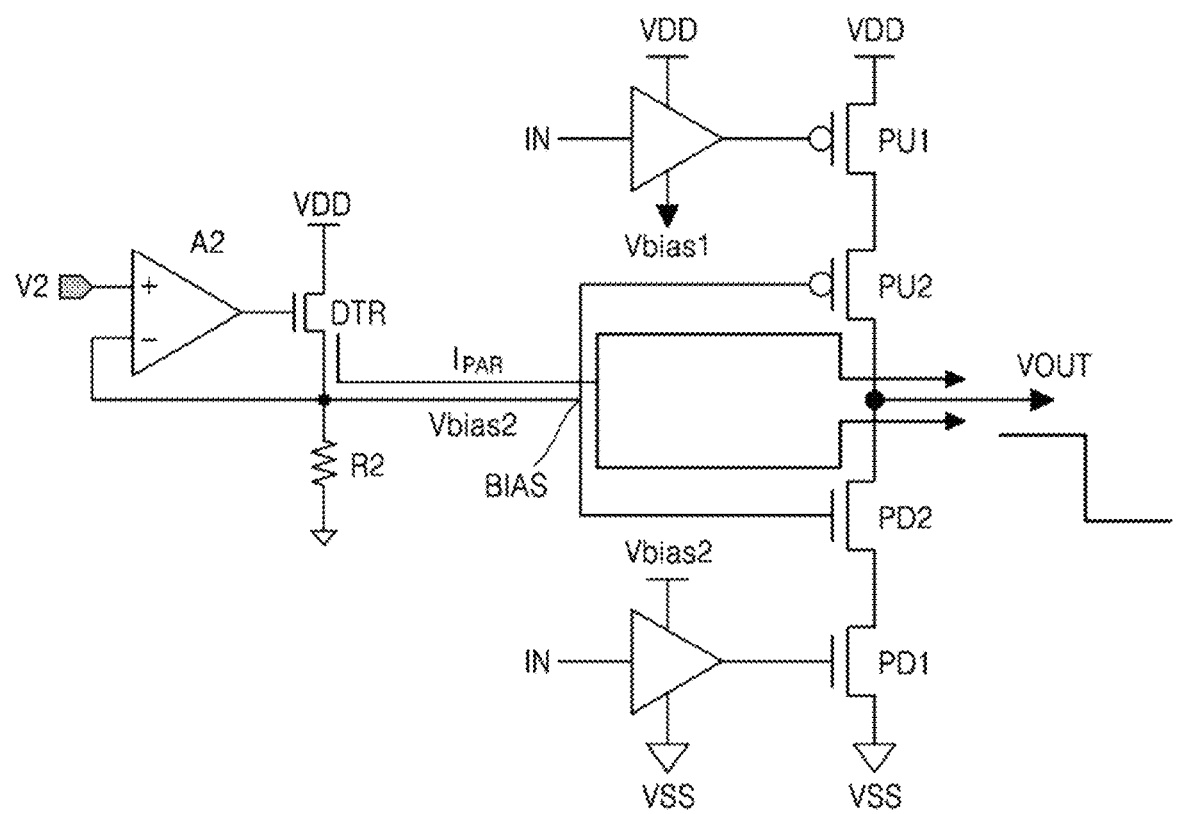
FIG. 11 is a circuit diagram illustrating an example in which a second bias voltage generating circuit transmits a parasitic current to an output voltage generating circuit when an output voltage decreases, according to some example embodiments of the inventive concepts.

FIG. 10 is a circuit diagram illustrating an example in which the first bias voltage generating circuit 100_1 receives a parasitic current when (e.g., in response to) output voltage VOUT increases, according to some example embodiments of the inventive concepts, and FIG. 11 is a circuit diagram illustrating an example in which the second bias voltage generating circuit 100_2 transmits a parasitic current to an output voltage generating circuit when (e.g., in response to) an output voltage decreases, according to some example embodiments of the inventive concepts.

Referring to FIGS. 4, 10, and 11, when (e.g., in response to) the output voltage VOUT is at a low level, the switching control circuit 200 may connect (e.g., selectively connect) the first bias voltage generating circuit 100_1 to the output voltage generating circuit 300. When (e.g., in response to) the output voltage VOUT is at a high level, the switching control circuit 200 may connect (e.g., selectively connect) the second bias voltage generating circuit 100_2 to the output voltage generating circuit 300. Although it has been described that the output voltage generating circuit 300 is connected to the first and second bias voltage generating circuits 100_1 and 100_2 through the switching control circuit 200, in order to explain a flow of a parasitic current $I_{PAR}$, FIGS. 10 and 11 show a state in which each of the first and second bias voltage generating circuits 100_1 and 100_2 is switched according to a level of the output voltage VOUT. The switching control circuit 200 is omitted in FIGS. 10 and 11.

Referring to FIG. 10, when (e.g., in response to) the output voltage VOUT is at a low level, gate terminals of a second pull-up transistor PU2 and a second pull-down transistor PD2 may receive a first bias voltage Vbias1 through a bias input terminal BIAS. When (e.g., in response to) the output voltage VOUT has a low-to-high transition, a parasitic current $I_{PAR}$ may be generated by parasitic capacitors of the second pull-up transistor PU2 and the second pull-down transistor PD2 and flow from a source or drain terminal of the second pull-up transistor PU2 and/or the second pull-down transistor PD2 to the gate terminal thereof.

When (e.g., in response to) the first bias voltage generating circuit 100_1 provides the first bias voltage Vbias1 to the output voltage generating circuit 300, a sinking transistor STR may be turned on by a first amplifier A1, and the parasitic current $I_{PAR}$ generated due to the low-to-high transition may be drawn to a ground node by the sinking transistor STR.

Referring to FIG. 11, when (e.g., in response to) the output voltage VOUT is at a high level, gate terminals of a second pull-up transistor PU2 and a second pull-down transistor PD2 may receive a second bias voltage Vbias2 through a bias input terminal BIAS. When (e.g., in response to) the output voltage VOUT has a high-to-low transition, a parasitic current $I_{PAR}$ may be generated by parasitic capacitors of the second pull-up transistor PU2 and the second pull-down transistor PD2 and flow from the gate terminal of the second pull-up transistor PU2 and/or the second pull-down transistor PD2 to a source or drain terminal thereof.

When (e.g., in response to) the second bias voltage generating circuit 100_2 provides the second bias voltage Vbias2 to the output voltage generating circuit 300, a driving transistor DTR may be turned on by a second amplifier A2, and the parasitic current $I_{PAR}$ generated due to the high-to-low transition may be provided from the second bias voltage generating circuit 100_2 to a parasitic capacitor by the driving transistor DTR.

Accordingly, the parasitic current $I_{PAR}$ generated during transition of the output voltage VOUT may have a minimal effect on a bias voltage so that the output driving circuit 10 may provide a stable bias voltage to the pull-up circuit and the pull-down circuit.

Figure 12:
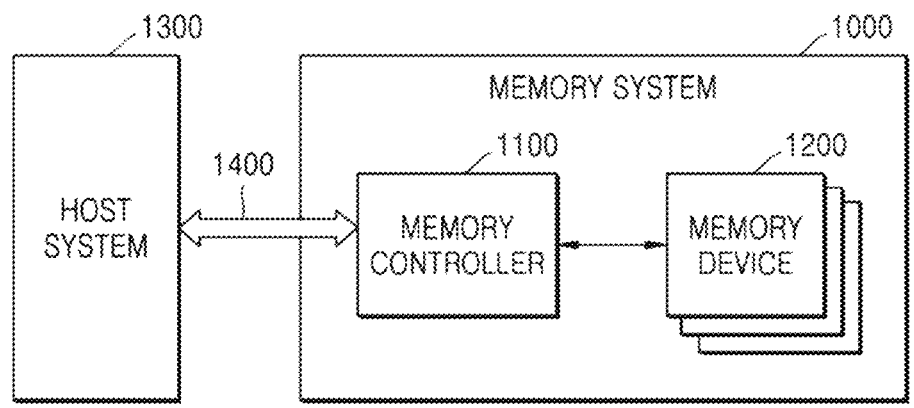
FIG. 12 is a block diagram of a memory system including an output driving circuit, according to some example embodiments of the inventive concepts.

FIG. 12 is a block diagram of a memory system 1000 including an output driving circuit, according to some example embodiments of the inventive concepts.

As shown in FIG. 12, the memory system 1000 may communicate with the host system 1300 via an interface 1400, and include a memory controller 1100 and memory devices 1200.

The interface 1400 may use an electrical signal and/or an optical signal, and as non-limiting examples, the interface 1400 may be implemented as a serial advanced technology attachment (SATA) interface, a SATA Express (SATAe) interface, a serial attached small computer system interface (SCSI) (SAS), a universal serial bus (USB) interface, or a combination thereof. The host system 1300 and the memory controller 1100 may each include a serializer/deserializer (SerDes) for serial communication.

In some embodiments, the memory system 1000 may communicate with the host system 1300 by being removably coupled to the host system 1300. Each of the memory devices 1200 may be a volatile or nonvolatile memory, and the memory system 1000 may also be referred to as a storage system. As non-limiting examples, the memory system 1000 may be implemented as a solid-state drive or solid-state disk (SSD), an embedded SSD (eSSD), a multimedia card (MMC), an embedded multimedia card (eMMC), etc. The memory controller 1100 may control the memory devices 1200 in response to a request received from the host system 1300 through the interface 1400.

Moreover, the output driving circuit 10 to which example embodiments of the inventive concepts are applied may be implemented to be included in each of the memory controller 1100, the memory devices 1200, and the host system 1300. In detail, the memory controller 1100, the memory devices 1200, and the host system 1300 may each amplify a data signal according to the example embodiments of the inventive concepts to transmit or receive a result of the amplification to or from other components.

Figure 13:
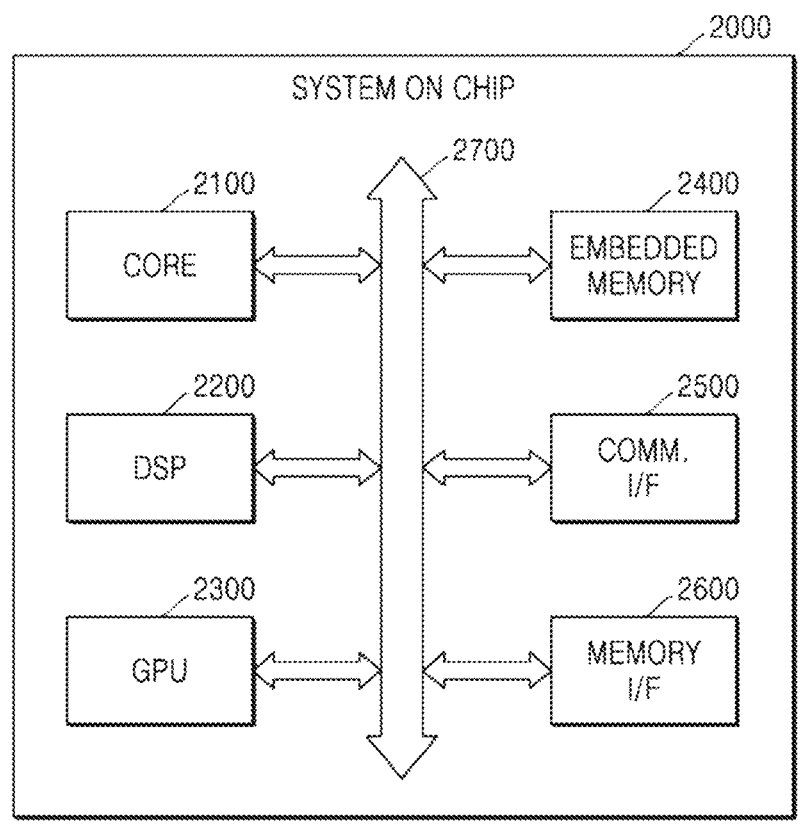
FIG. 13 is a block diagram of a system-on-chip (SoC) including an output driving circuit, according to some example embodiments of the inventive concepts.

FIG. 13 is a block diagram of a system-on-chip (SoC) 2000 including an output driving circuit, according to some example embodiments of the inventive concepts.

The SoC 2000 may refer to an integrated circuit that integrates components of a computing system or other electronic systems. For example, an application processor (AP) that is a type of the SoC 2000 may include a processor and components having other functions.

Referring to FIG. 13, the SoC 2000 may include a core 2100, a digital signal processor (DSP) 2200, a graphics processing unit (GPU) 2300, an embedded memory 2400, a communication interface (I/F) 2500, and a memory interface 2600. Components of the SoC 2000 may communicate with one another via a bus 2700.

The core 2100 may process instructions and control operations of the components included in the SoC 2000. For example, by processing a series of instructions, the core 2100 may drive an operating system and run applications on the operating system. The DSP 2200 may generate effective data by processing digital signals such as those provided from the communication interface 2500. The GPU 2300 may generate data for an image output through a display device based on image data provided from the embedded memory 2400 or the memory interface 2600, or encode the image data. The embedded memory 2400 may store data necessary for the core 2100, the DSP 2200, and the GPU 2300 to operate. The memory interface 2600 may provide an interface to an external memory of the SoC 2000, such as dynamic random access memory (DRAM), a flash memory, etc.

The communication interface 2500 may provide serial communication with outside the SoC 2000. For example, the communication interface 2500 may be connected to Ethernet and include SerDes for serial communication.

Moreover, the output driving circuit 10 to which example embodiments of the inventive concepts are applied may be applied to the communication interface 2500 and the memory interface 2600. In detail, the communication interface 2500 or memory interface 2600 may amplify a data signal by using the methods according to the example embodiments of the inventive concepts to transmit or receive a result of the amplification to or from a communication device or memory device.

In addition, the output driving circuit 10 to which the example embodiments of the inventive concepts are applied may be applied to the core 2100, the DSP 2200, the GPU 2300, and the embedded memory 2400. In detail, the core 2100, the DSP 2200, the GPU 2300, and the embedded memory 2400 may each amplify a data signal by using a method according to some example embodiments of the inventive concepts to transmit or receive a result of the amplification to or from other components via the bus 2700.

As described herein, any devices, systems, blocks, modules, units, controllers, circuits, and/or portions thereof according to any of the example embodiments (including, without limitation, the output driving circuit, the first bias voltage generating circuit 100_1, the second bias voltage generating circuit 100_2, the switching control circuit 200, the output voltage generating circuit 300, the memory system 1000, the memory controller 1100, the memory devices 1200, the host system 1300, the interface 1400, the SoC 2000, the core 2100, the digital signal processor (DSP) 2200, the graphics processing unit (GPU) 2300, the embedded memory 2400, the communication interface 2500, and the memory interface 2600, the bus 2700, any portion thereof, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, blocks, modules, units, controllers, circuits, and/or portions thereof according to any of the example embodiments, and/or any portions thereof, including for example some or all operations of any of the methods shown in FIGS. 8-9.

While the inventive concepts have been particularly shown and described with reference to some example embodiments thereof, it will be understood that various changes in form and details may be made therein without departing from the spirit and scope of the following claims.

What is claimed is:

1. An output driving circuit, comprising:
a plurality of bias voltage generating circuits configured to generate a plurality of bias voltages;
a switching control circuit; and
an output voltage generating circuit,
wherein the switching control circuit is configured to selectively connect one bias voltage generating circuit of the plurality of bias voltage generating circuits to the output voltage generating circuit based on an output voltage, and
wherein the output voltage generating circuit is configured to transmit and receive a parasitic current generated due to transition of the output voltage to and from the one bias voltage generating circuit selectively connected to the output voltage generating circuit through the switching control circuit.

2. The output driving circuit of claim 1, wherein the one bias voltage generating circuit selectively connected to the output voltage generating circuit through the switching control circuit is configured to
receive the parasitic current from the output voltage generating circuit in response to the output voltage transitioning from a low level to a high level, and
provide the parasitic current to the output voltage generating circuit in response to the output voltage transitioning from the high level to the low level.

3. The output driving circuit of claim 1, wherein
the output voltage generating circuit comprises a pull-down transistor circuit and a pull-up transistor circuit, and
the pull-down transistor circuit and the pull-up transistor circuit are configured to receive one of a first bias voltage or a second bias voltage generated by the one bias voltage generating circuit selectively connected to the output voltage generating circuit through the switching control circuit, the one bias voltage generating circuit selectively connected to the output voltage generating circuit is one of a first bias voltage generating circuit or a second bias voltage generating circuit.

4. The output driving circuit of claim 3, wherein
the pull-up transistor circuit includes
a first pull-up transistor configured to receive a pull-up signal, and
a second pull-up transistor connected to the first pull-up transistor in cascade and configured to receive the one of the first bias voltage or the second bias voltage, and
the pull-down transistor circuit includes a first pull-down transistor configured to receive a pull-down signal, and a second pull-down transistor connected to the first pull-down transistor in cascade and configured to receive the one of the first bias voltage or the second bias voltage.

5. The output driving circuit of claim 4, wherein
the plurality of bias voltage generating circuits comprise the first bias voltage generating circuit and the first bias voltage generating circuit is configured to output the first bias voltage, the switching control circuit is further configured to, in response to the output voltage having a low-to-high transition, provide the first bias voltage to gate terminals of the second pull-up transistor and the second pull-down transistor, and the second pull-up transistor is configured to be activated in response to the first bias voltage and the second pull-down transistor is configured to be deactivated in response to the first bias voltage.

6. The output driving circuit of claim 5, wherein the first bias voltage generating circuit is further configured to
receive parasitic currents generated by gate parasitic capacitors of the second pull-down transistor and the second pull-up transistor, and
draw the received parasitic currents to a ground node.

7. The output driving circuit of claim 5, wherein
the plurality of bias voltage generating circuits comprise the second bias voltage generating circuit and the second bias voltage generating circuit is configured to output the second bias voltage having a higher voltage level than the first bias voltage, the switching control circuit is further configured to, in response to the output voltage having a high-to-low transition, provide the second bias voltage to the gate terminals of the second pull-up transistor and the second pull-down transistor, and the second pull-up transistor is configured to be deactivated in response to the second bias voltage and the second pull-down transistor configured to be activated in response to the second bias voltage.

8. The output driving circuit of claim 7, wherein the second bias voltage generating circuit is further configured to supply a current generated by a power supply node to gate parasitic capacitors of the second pull-down transistor and the second pull-up transistor.

9. The output driving circuit of claim 1, wherein
the one bias voltage generating circuit selectively connected to the output voltage generating circuit is one of a first bias voltage generating circuit or a second bias voltage generating circuit, and the switching control circuit is further configured to
provide a first bias voltage generated by the first bias voltage generating circuit of the plurality of bias voltage generating circuits to the output voltage generating circuit in response to the output voltage having a low level, and provide a second bias voltage generated by the second bias voltage generating circuit of the plurality of bias voltage generating circuits to the output voltage generating circuit in response to the output voltage having a high level.

10. A method of driving an output voltage, the method comprising:
generating, by a plurality of bias voltage generating circuits, a plurality of bias voltages;

determining, based on a type of transition of the output voltage, one of the plurality of bias voltage generating circuits for a pull-up transistor circuit and a pull-down transistor circuit; and transmitting and receiving a parasitic current that is generated due to transition of the output voltage to and from the one of the plurality of bias voltage generating circuits.

11. The method of claim 10, wherein the one of the plurality of bias voltage generating circuits is one of a first bias voltage generating circuit or a second bias voltage generating circuit, wherein the transmitting and the receiving of the parasitic current to and from the one of the plurality of bias voltage generating circuits comprises:
in response to the output voltage transitioning from a low level to a high level, transmitting the parasitic current from the pull-up transistor circuit and the pull-down transistor circuit to the first bias voltage generating circuit; and in response to the output voltage transitioning from the high level to the low level, transmitting the parasitic current from the second bias voltage generating circuit to the pull-up transistor circuit and the pull-down transistor circuit.

12. An output driving circuit, comprising:
a pull-up circuit configured to cause an output voltage to transition from a low level to a high level based on connecting a power supply node to an output node in response to a pull-up signal;

a pull-down circuit configured to cause the output voltage to transition from the high level to the low level based on connecting a ground node to the output node in response to a pull-down signal;

a first bias voltage generating circuit configured to
provide a first bias voltage to the pull-up circuit and the pull-down circuit in response to the output voltage having a first type of transition, and receive a parasitic current generated in the pull-up circuit and the pull-down circuit;

a second bias voltage generating circuit configured to
provide a second bias voltage to the pull-up circuit and the pull-down circuit in response to the output voltage having a second type of transition, and provide a parasitic current to the pull-up circuit and the pull-down circuit; and a switching control circuit configured to connect, according to a level of the output voltage, one of the first bias voltage generating circuit or the second bias voltage generating circuit to the pull-up circuit and the pull-down circuit.

13. The output driving circuit of claim 12, wherein
the pull-up circuit includes
a first pull-up transistor configured to receive the pull-up signal; and a second pull-up transistor connected to the first pull-up transistor in cascade and configured to receive one of the first bias voltage or the second bias voltage according to a type of transition of the output voltage, and the pull-down circuit includes
a first pull-down transistor configured to receive the pull-down signal; and a second pull-down transistor connected to the first pull-down transistor in cascade and configured to receive one of the first bias voltage or the second bias voltage according to the type of transition of the output voltage.

14. The output driving circuit of claim 13, wherein the second pull-up transistor and the second pull-down transistor are further configured to receive a bias voltage at a gate terminal thereof, the bias voltage being generated by the one of the first bias voltage generating circuit or the second bias voltage generating circuit.

15. The output driving circuit of claim 12, wherein the first bias voltage generating circuit comprises:
   a first power supply node configured to receive a supply voltage;
   a first resistor connected between the first power supply node and a first bias voltage output node that is configured to output the first bias voltage;
   a first comparator including a first input terminal connected to the first bias voltage output node and a second input terminal configured to receive a first voltage, wherein the first comparator is configured to compare the first bias voltage with the first voltage; and
   a sinking transistor having a gate terminal configured to receive a result of the comparing by the first comparator, one source or drain terminal connected to the first bias voltage output node, and another source or drain terminal connected to a ground node,
   wherein the first bias voltage generating circuit is configured to, in response to the first bias voltage being provided to the pull-up circuit and the pull-down circuit, cause the parasitic current to flow to the ground node connected to the sinking transistor.

16. The output driving circuit of claim 12, wherein the second bias voltage generating circuit comprises:
   a second power supply node configured to receive a supply voltage;
   a second resistor connected between a ground node and a second bias voltage output node that is configured to output the second bias voltage;
   a second comparator including a first input terminal connected to the second bias voltage output node and a second input terminal configured to receive a second voltage, wherein the second comparator is configured to compare the second bias voltage with the second voltage; and
   a driving transistor having a gate terminal configured to receive a result of the comparing by the second comparator, one source or drain terminal connected to the second bias voltage output node, and another source or drain terminal connected to the second power supply node, and
   wherein the second bias voltage generating circuit is configured to, in response to the second bias voltage being provided to the pull-up circuit and the pull-down circuit, cause the parasitic current to flow from the second power supply node connected to the driving transistor.

17. The output driving circuit of claim 12, wherein the switching control circuit comprises:
   a first transistor configured to be activated and provide the first bias voltage to the pull-up circuit and the pull-down circuit in response to the switching control circuit receiving the output voltage having the low level as a feedback voltage; and
   a second transistor configured to be activated and provide the second bias voltage to the pull-up circuit and the pull-down circuit in response to the switching control circuit receiving the output voltage having the high level as the feedback voltage.

18. The output driving circuit of claim 17, wherein
   the first transistor includes one source or drain terminal connected to the first bias voltage generating circuit and another source or drain terminal connected to the pull-up circuit and the pull-down circuit, wherein the first transistor is configured to provide the first bias voltage to the pull-up circuit and the pull-down circuit in response to a voltage having the low level being received at a gate terminal of the first transistor, and
   the second transistor includes one source or drain terminal connected to the second bias voltage generating circuit and another source or drain terminal connected to the pull-up circuit and the pull-down circuit, wherein the second transistor is configured to provide the second bias voltage to the pull-up circuit and the pull-down circuit in response to a voltage having the high level being received at a gate terminal of the second transistor.

19. The output driving circuit of claim 17, wherein the switching control circuit further comprises an inverter, wherein the inverter is configured to connect, according to a level of the output voltage, an output terminal of the switching control circuit to one of a gate terminal of the first transistor or a gate terminal of the second transistor.

20. The output driving circuit of claim 19, wherein the inverter is further configured to
   connect the output terminal of the switching control circuit to the gate terminal of the first transistor in response to the output voltage having the high level, and
   connect the output terminal of the switching control circuit to the gate terminal of the second transistor in response to the output voltage having the low level.

* * * * *